US009799266B2

(12) United States Patent
Gil (10) Patent No.: US 9,799,266 B2
(45) Date of Patent: Oct. 24, 2017

(54) ORGANIC LIGHT-EMITTING DIODE DISPLAY

(71) Applicant: Samsung Display Co., Ltd., Yongin-si, Gyeonggi-do (KR)

(72) Inventor: Elly Gil, Yongin-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/844,290

(22) Filed: Sep. 3, 2015

(65) Prior Publication Data

US 2016/0210896 A1 Jul. 21, 2016

(30) Foreign Application Priority Data

Jan. 19, 2015 (KR) .................. 10-2015-0008860

(51) Int. Cl.
*G09G 3/32* (2016.01)
*G09G 3/3233* (2016.01)
*H01L 51/00* (2006.01)

(52) U.S. Cl.
CPC ........... *G09G 3/3233* (2013.01); *H01L 51/00* (2013.01); *G09G 2300/0426* (2013.01); *G09G 2300/0819* (2013.01); *G09G 2300/0842* (2013.01); *G09G 2300/0861* (2013.01); *G09G 2310/0262* (2013.01); *G09G 2320/0223* (2013.01)

(58) Field of Classification Search
USPC ........................................................ 345/205
See application file for complete search history.

(56) References Cited

U.S. PATENT DOCUMENTS

| 2004/0196239 A1* | 10/2004 | Kwon ............ G09G 3/325 345/92 |
| 2005/0258466 A1* | 11/2005 | Kwak ............ G09G 3/3233 257/306 |
| 2011/0181583 A1* | 7/2011 | Kim ............ G09G 3/3648 345/212 |
| 2011/0291115 A1 | 12/2011 | Kim et al. |

(Continued)

FOREIGN PATENT DOCUMENTS

| KR | 10-2011-0131973 A | 12/2011 |
| KR | 10-2014-0061140 A | 5/2014 |

(Continued)

*Primary Examiner* — Carolyn R Edwards
*Assistant Examiner* — Deeprose Subedi
(74) *Attorney, Agent, or Firm* — Knobbe, Martens, Olson & Bear, LLP (57) ABSTRACT

An organic light-emitting diode display is disclosed. In one aspect, the OLED display includes first and second pixels respectively including first and second capacitors, each of the first and second capacitors including top and bottom electrodes. The first and second pixels respectively include first and second pixel electrodes. The display also includes a substrate, a first conductive layer formed over the substrate and including the bottom electrodes of the first and second capacitors, and a second conductive layer formed over the first conductive layer and including the top electrodes of the first and second capacitors. The display further includes a third conductive layer formed over the second conductive layer and including the first and second pixel electrodes, and a connection node electrically connecting the first capacitor to the second capacitor.

21 Claims, 6 Drawing Sheets

(56) References Cited

U.S. PATENT DOCUMENTS

| | | | |
|---|---|---|---|
| 2012/0013597 A1 | 1/2012 | Han | |
| 2013/0140538 A1* | 6/2013 | Fujita | H01L 27/3225 |
| | | | 257/40 |
| 2014/0132584 A1 | 5/2014 | Kim | |
| 2014/0231764 A1 | 8/2014 | Park et al. | |
| 2014/0239270 A1 | 8/2014 | Ko et al. | |

FOREIGN PATENT DOCUMENTS

| | | |
|---|---|---|
| KR | 10-2014-0104263 A | 8/2014 |
| KR | 10-2014-0108023 A | 9/2014 |

\* cited by examiner

ORGANIC LIGHT-EMITTING DIODE DISPLAY

RELATED APPLICATION

This application claims the benefit of Korean Patent Application No. 10-2015-0008860, filed on Jan. 19, 2015, in the Korean Intellectual Property Office, the disclosure of which is incorporated herein in its entirety by reference.

BACKGROUND

Field

The described technology generally relates to an organic light-emitting diode display.

Description of the Related Technology

Compared to a similar size LCD display, the thickness and weight of an OLED display can be reduced due to its being self-emissive and its simpler set of layers. Furthermore, OLED technology has favorable characteristics such as low power consumption, high brightness contrast, and fast refresh rate.

A panel of an OLED display generally includes a plurality of pixels arranged in the shape of a N×M matrix, where data signals Dm, scan signals Sn, and a power voltage ELVDD are applied to the respective pixels. A power voltage ELVDD can be supplied to all pixel circuits in common. There is parasitic resistance at wirings for supplying a power voltage ELVDD to respective pixels and, when the power voltage ELVDD is supplied via the wirings, a voltage drop occurs due to the parasitic resistance.

SUMMARY OF CERTAIN INVENTIVE ASPECTS

One inventive aspect relates to an OLED display that stably includes a large high-resolution panel by preventing a voltage drop of a power voltage ELVDD and securing spaces between wirings by forming the wirings for supplying the power voltage ELVDD in a mesh structure.

Another aspect is an organic light-emitting diode (OLED) display including a first pixel including a first capacitor and a second pixel including a second capacitor, the OLED display includes a substrate; a first conductive layer, which is arranged on the substrate and includes a bottom electrode of the first capacitor and a bottom electrode of the second capacitor; a second conductive layer, which is arranged on the first conductive layer and includes a top electrode of the first capacitor and a top electrode of the second capacitor; and a third conductive layer, which is arranged on the second conductive layer and includes a first pixel electrode of the first pixel, a second pixel electrode of the second pixel, and a connection node interconnecting the first capacitor, and the second capacitor.

The first conductive layer includes a scan line connected to the first pixel and the second pixel.

The second conductive layer includes a first data line connected to the first pixel and a second data line connected to the second pixel.

The connection node is arranged across a portion above the first and second data lines.

The second conductive layer includes a first power line and a second power line for supplying power voltages, the first power line is integrated with the top electrode of the first capacitor, and the second power line is integrated with the top electrode of the second capacitor.

The first capacitor and the second capacitor are adjacent to each other in a row-wise direction.

The OLED display further includes an organic insulation layer between the second conductive layer and the third conductive layer, wherein the connection node includes contact plugs, which penetrate through the organic insulation layer and are connected to the first capacitor and the second capacitor.

The connection node includes at least one of ITO, IZO, ZnO, and $In_2O_3$.

The OLED display further includes a first thin-film transistor (TFT), which uses the bottom electrode of the first capacitor as a gate; a second TFT, which uses the bottom electrode of the second capacitor as a gate; and an active layer, which is arranged below the first conductive layer and includes an active pattern of the first TFT and an active pattern of the second TFT.

The OLED display further includes a third pixel including a third capacitor; and a third pixel including a fourth capacitor, wherein the second conductive layer includes a top electrode of the third capacitor and a top electrode of the fourth capacitor, the top electrode of the third capacitor is integrated with the top electrode of the first capacitor, and the top electrode of the fourth capacitor is integrated with the top electrode of the second capacitor.

Another aspect is an organic light-emitting diode (OLED) display that includes a first pixel including a first capacitor having a first bottom electrode and a first top electrode; a second pixel including a second capacitor having a second bottom electrode and a second top electrode; a first conductive layer, which includes the first bottom electrode, the second bottom electrode, and a connection node interconnecting the first top electrode and the second top electrode; and a second conductive layer, which is arranged on the first conductive layer and includes the first top electrode, the second top electrode, and a power line for supplying power voltages to the first pixel and the second pixel.

The OLED display further includes a third conductive layer, which is arranged on the second conductive layer and includes a first pixel electrode of the first pixel and a second pixel electrode of the second pixel.

The first conductive layer includes a scan line connected to the first pixel and the second pixel.

The second conductive layer includes a first data line connected to the first pixel and a second data line connected to the second pixel.

The connection node is arranged across a portion below the first and second data lines.

The connection node is formed to be apart from the first and second bottom electrodes.

The first capacitor and the second capacitor are adjacent to each other in a row-wise direction, and the power line is integrated with the top electrode of the first capacitor or the top electrode of the second capacitor.

The OLED display further includes an organic insulation layer between the second conductive layer and the third conductive layer, wherein the first and second top electrodes include contact plugs, which penetrate through the organic insulation layer and are connected to the connection node.

The OLED display further includes a first thin-film transistor (TFT), which uses the bottom electrode of the first capacitor as a gate; a second TFT, which uses the bottom electrode of the second capacitor as a gate; and an active layer, which is arranged below the first conductive layer and includes an active pattern of the first TFT and an active pattern of the second TFT.

The OLED display further includes a third pixel including a third capacitor; and a third pixel including a fourth capacitor, wherein the second conductive layer includes a top electrode of the third capacitor and a top electrode of the fourth capacitor, the top electrode of the third capacitor is integrated with the top electrode of the first capacitor, and the top electrode of the fourth capacitor is integrated with the top electrode of the second capacitor.

Another aspect is an organic light-emitting diode (OLED) display, the OLED display comprising: first and second pixels respectively including first and second capacitors, wherein each of the first and second capacitors includes top and bottom electrodes, and wherein the first and second pixels respectively include first and second pixel electrodes; a substrate; a first conductive layer formed over the substrate and including the bottom electrodes of the first and second capacitors; a second conductive layer formed over the first conductive layer and including the top electrodes of the first and second capacitors; and a third conductive layer formed over the second conductive layer and including the first and second pixel electrodes, and a connection node electrically connecting the first capacitor to the second capacitor.

In the above OLED display, the first conductive layer comprises a scan line electrically connected to the first and second pixels.

In the above OLED display, the second conductive layer comprises i) a first data line electrically connected to the first pixel and ii) a second data line electrically connected to the second pixel.

In the above OLED display, the connection node is formed over the first and second data lines.

In the above OLED display, the second conductive layer comprises a first power line and a second power line configured to supply power voltages, wherein the first power line is integrally formed with the top electrode of the first capacitor, and wherein the second power line is integrally formed with the top electrode of the second capacitor.

In the above OLED display, the first and second capacitors are adjacent to each other.

The above OLED display further comprises an organic insulation layer formed between the second and third conductive layers, wherein the connection node comprises a plurality of contact plugs penetrating through the organic insulation layer and electrically connected to the first and second capacitors.

In the above OLED display, the connection node is formed of at least one of ITO, IZO, ZnO, and $In_2O_3$.

The above OLED display further comprises: a first thin-film transistor (TFT) including the bottom electrode of the first capacitor configured to function as a gate electrode; a second TFT including the bottom electrode of the second capacitor configured to function as a gate electrode, wherein each of the first and second TFTs includes an active pattern; and an active layer formed below the first conductive layer and including the active patterns of the first and second TFTs.

The above OLED display further comprises: third and fourth pixels respectively comprising third and fourth capacitors, wherein each of the third and fourth capacitors includes a top electrode, wherein the second conductive layer further includes the top electrodes of the third and fourth capacitors, wherein the top electrode of the third capacitor is integrally formed with the top electrode of the first capacitor, and wherein the top electrode of the fourth capacitor is integrally formed with the top electrode of the second capacitor.

Another aspect is an organic light-emitting diode (OLED) display comprising: a first pixel comprising a first capacitor including a first bottom electrode and a first top electrode; a second pixel comprising a second capacitor including a second bottom electrode and a second top electrode; a first conductive layer including the first and second bottom electrodes and a connection node electrically connecting the first top electrode to the second top electrode; and a second conductive layer formed over the first conductive layer and including the first and second top electrodes and a power line configured to supply power voltages to the first and second pixels.

The above OLED display further comprises a third conductive layer formed over the second conductive layer, wherein the first and second pixels respectively include first and second pixel electrodes, and wherein the third conductive layer includes the first and second pixel electrodes.

In the above OLED display, the first conductive layer comprises a scan line electrically connected to the first and second pixels.

In the above OLED display, the second conductive layer comprises i) a first data line electrically connected to the first pixel and ii) a second data line electrically connected to the second pixel.

In the above OLED display, the connection node is formed below the first and second data lines.

In the above OLED display, the connection node is formed apart from the first and second bottom electrodes.

In the above OLED display, the first and second capacitors are adjacent to each other, wherein the power line is integrally formed with the top electrode of the first capacitor or the top electrode of the second capacitor.

The above OLED display further comprises an organic insulation layer formed between the second and third conductive layers, wherein the first and second top electrodes comprise a plurality of contact plugs, and wherein the contact plugs penetrate through the organic insulation layer and are electrically connected to the connection node.

The above OLED display further comprises: a first thin-film transistor (TFT) include the bottom electrode of the first capacitor configured to function as a gate electrode; a second TFT include the bottom electrode of the second capacitor configured to function as a gate electrode, wherein each of the first and second TFTs includes an active pattern; and an active layer formed below the first conductive layer and including the active patterns of the first and second TFTs.

The above OLED display further comprises: third and fourth pixels respectively comprising third and fourth capacitors, wherein each of the third and fourth capacitors includes a top electrode, wherein the second conductive layer further includes the top electrodes of the third and fourth capacitors, wherein the top electrode of the third capacitor is integrally formed with the top electrode of the first capacitor, and wherein the top electrode of the fourth capacitor is integrally formed with the top electrode of the second capacitor.

DETAILED DESCRIPTION OF CERTAIN INVENTIVE EMBODIMENTS

As the described technology allows for various changes and numerous embodiments, particular embodiments will be illustrated in the drawings and described in detail in the written description. However, this is not intended to limit the described technology to particular modes of practice, and it is to be appreciated that all changes, equivalents, and substitutes that do not depart from the spirit and technical scope of the described technology are encompassed in the described technology. In the description of the described technology, certain detailed explanations of the related art are omitted when it is deemed that they can unnecessarily obscure the essence of the described technology.

While such terms as "first," "second," etc., can be used to describe various components, such components must not be limited to the above terms. The above terms are used only to distinguish one component from another.

It will be understood that when a layer, region, or component is referred to as being "formed on" another layer, region, or component, it can be directly or indirectly formed on the other layer, region, or component. That is, for example, intervening layers, regions, or components can be present.

Reference will now be made in detail to exemplary embodiments, examples of which are illustrated in the accompanying drawings, wherein like reference numerals refer to like elements throughout. In this regard, the present exemplary embodiments can have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. Sizes of elements in the drawings can be exaggerated for convenience of explanation. In other words, since sizes and thicknesses of components in the drawings are arbitrarily illustrated for convenience of explanation, the following embodiments are not limited thereto. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
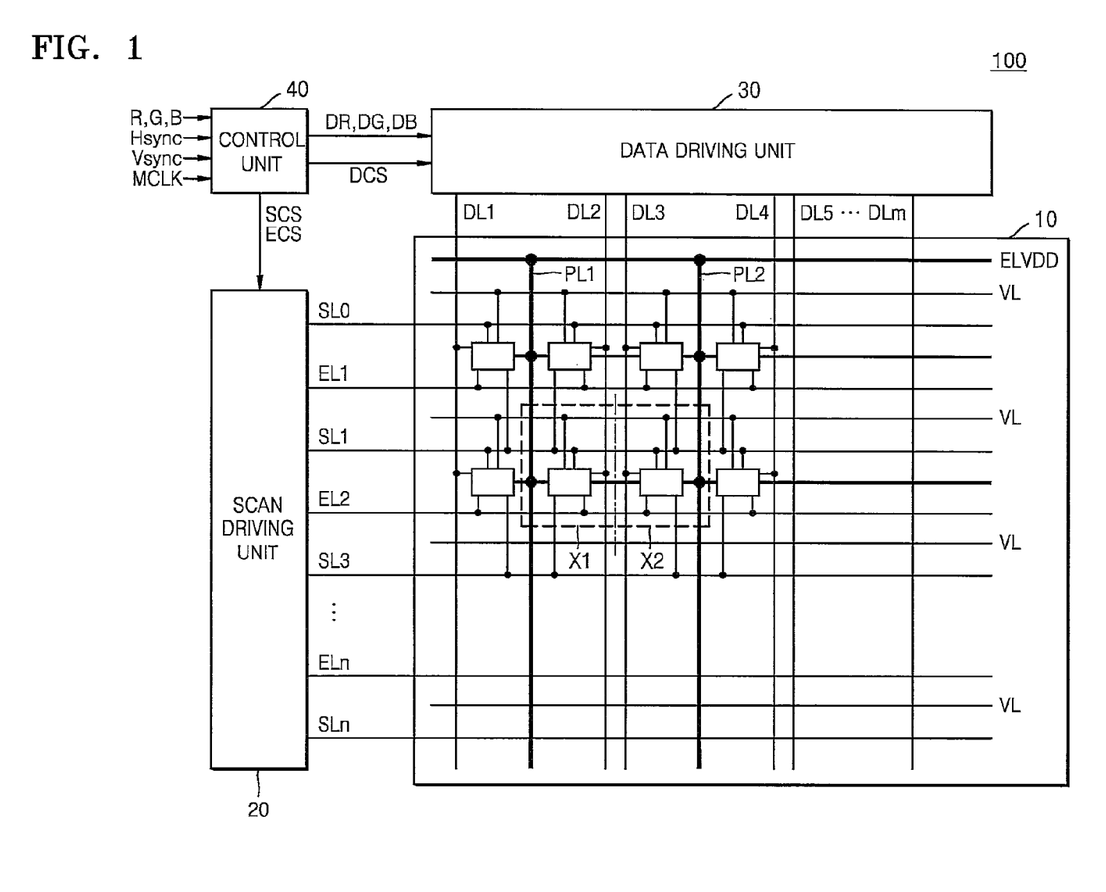
FIG. 1 is a schematic block diagram of a display device according to embodiments.

FIG. 1 is a schematic block diagram of a display device 100 according to embodiments. Depending on embodiments, certain elements may be removed from or additional elements may be added to the display device 100 illustrated in FIG. 1. Furthermore, two or more elements may be combined into a single element, or a single element may be realized as multiple elements.

A display device 100 according to an embodiment includes a display unit 10 including a plurality of pixels, a scan driving unit or scan driver 20, a data driving unit or data driver 30, and a control unit or controller 40. The scan driving unit 20, the data driving unit 30, and the control unit 40 can be respectively formed on individual semiconductor chips or can be integrated on a single semiconductor chip. Furthermore, the scan driving unit 20 can be formed on a same substrate as the display unit 10.

The display unit 10 includes a plurality of pixels that are respectively arranged at intersections among a plurality of scan lines SL0 through SLn, a plurality of data lines DL1 through DLm, and a plurality of emission control lines EU through ELn and are arranged in a matrix-like shape.

Each pixel is connected to two scan lines from among the scan lines SL0 through SLn transmitted to the display unit 10. In FIG. 1, a pixel is connected to a scan line corresponding to a corresponding pixel line and a scan line corresponding to a previous pixel line. However, the described technology is not limited thereto.

Furthermore, each pixel is connected to one data line from among the data lines DL1 through Dan and one emission control line from among the emission control lines EL1 through ELn.

Furthermore, each pixel is connected to one initializing voltage line from among a plurality of initializing voltage lines VL supplying an initializing voltage and to a plurality of power lines PL supplying a first power voltage ELVDD.

Two pixels adjacent to each other are substantially symmetrical in a row direction (a pixel line direction or a horizontal direction) in which the scan lines SL0 through SLn extend. Two pixels adjacent to each other in a symmetrical structure shares an initializing voltage line VL arranged in a row direction. Power lines PL arranged along column lines corresponding to two pixels adjacent to each other in a symmetrical structure are a designated distance apart from each other, are parallel to each other, and face each other, where two power lines PL symmetrical along column lines are connected to each other via a power line PL arranged along a row line and form a mesh-like structure.

The scan driving unit 20 generates two corresponding scan signals and transmits the two scan signals to respective pixels via the scan lines SL0 through SLn. For example, the scan driving unit 20 transmits a first scan signal via a scan line corresponding to a row line including respective pixels and transmits a second scan signal via a scan ling corresponding to a previous row line of the row line which receives the first scan signal. For example, the scan driving unit 20 transmits a first scan signal Sn via an $n^{th}$ scan line SLn to a pixel arranged at an $m^{th}$ column line at an $n^{th}$ row line and transmits a second scan signal Sn−1 via an n−$1^{th}$ scan line SLn−1 to the pixel. Furthermore, the scan driving unit 20 generates a plurality of emission control signals EM1 through EMn and transmits the same to the respective pixels via a plurality of emission control lines EL1 through ELn. Although scan signals and emission control signals are generated by the same scan driving unit 20 according to the present embodiment, the described technology is not limited thereto. The display device 100 can further include an emission control driving unit or emission control driver, and emission control signals can be generated by the emission control driving unit.

The data driving unit 30 transmits data signals D1 through Dm to the respective pixels via a plurality of data lines DL1 through DLm.

The control unit 40 converts a plurality of video signals R, G, and B transmitted from outside into a plurality of video data signals DR, DG, and DB and transmit the video data signals DR, DG, and DB to the data driving unit 30. Furthermore, the control unit 40 receives a vertical synchronization signal Vsync, a horizontal synchronization signal Hsync, and a clock signal MCLK. The control unit 40 generates control signals for controlling operations of the scan driving unit 20 and the data driving unit 30 and respectively transmits the control signals to the scan driving unit 20 and the data driving unit 30. For example, the control unit 40 generates and transmits a scan driving control signal SCS and an emission driving control signal ECS for controlling the scan driving unit 20 and a data driving control signal DCS for controlling the data driving unit 30.

A plurality of pixels emit light of designated or predetermined brightness based on driving currents holed supplied to organic light-emitting diode (OLED) according to the data signals D0 through Dm transmitted via the plurality of data lines DL1 through DLna, respectively.

Figure 2:
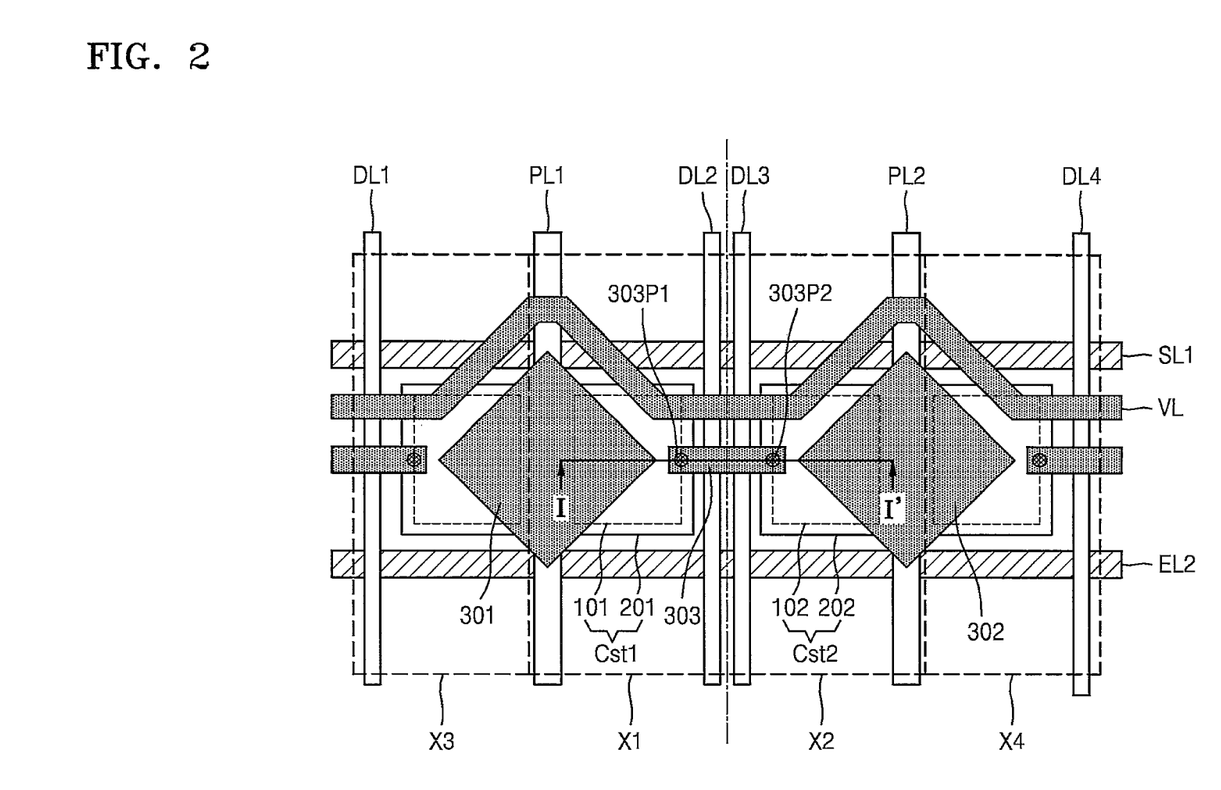
FIG. 2 is a schematic plan view of two adjacent pixels of a display device according to an embodiment.
Figure 3:
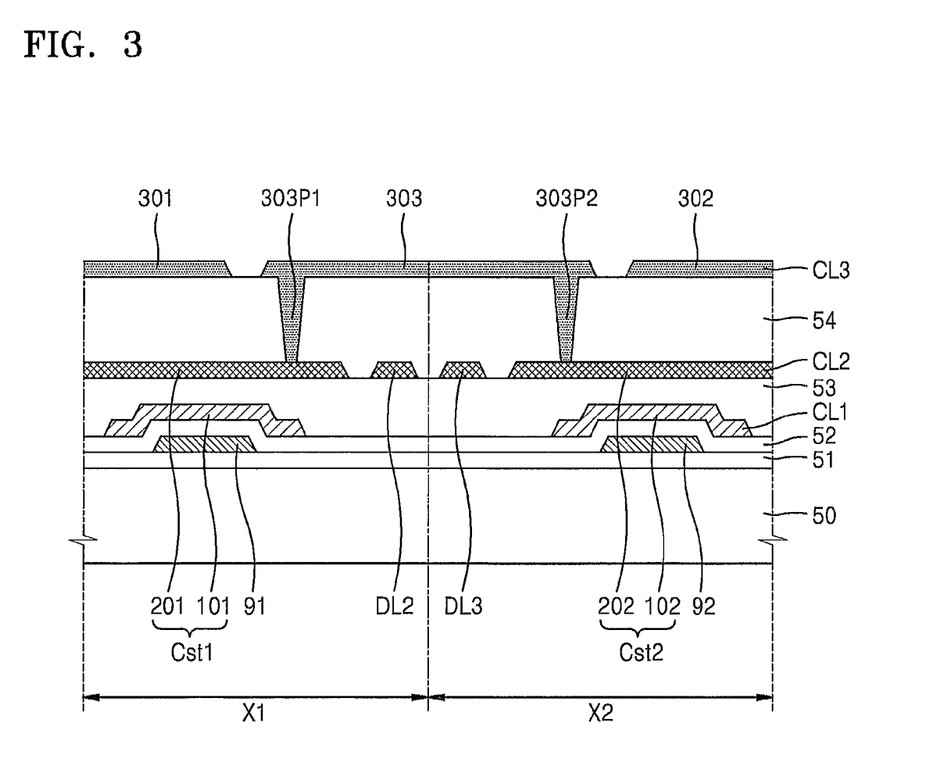
FIG. 3 is a sectional view obtained along a line I-I' of FIG. 2.

FIG. 2 is a schematic plan view of two adjacent pixels of a display device according to an embodiment. FIG. 3 is a sectional view obtained along a line I-I' of FIG. 2.

A first pixel X1 and a second pixel X2, which are two adjacent pixels of the display device 100 according to an embodiment, include pixel circuits including storage capacitors Cst. Furthermore, the first pixel X1 and the second pixel X2 include organic light-emitting diodes (OLED) that receive driving voltages from the pixel circuits and emit lights. Meanwhile, for convenience of explanation, FIGS. 2 and 3 show only layers from a substrate 50 to pixel electrodes 301 and 302.

First, referring to FIG. 2, the first pixel X1 and the second pixel X2 include a first scan line SL1 for transmitting a scan signal to a switching thin-film transistor (TFT), an emission control line EL2 for transmitting an emission control signal to an emission control TFT, data lines DL1 through DL4 for transmitting data signals, power lines PL1 and PL2 for transmitting a power voltage ELVDD, and an initializing voltage line VL for transmitting an initializing voltage Vint for initializing a driving TFT, where the data lines DL1 through DL4, the power lines PL1 and PL2, and the initializing voltage Vint intersect the first scan line SL1.

Here, the initializing voltage line VL, the first scan line SL1, and the emission control line EL2 are formed substantially in parallel to one another in a horizontal direction, whereas the data lines DL1 through DL4 and the power lines PL1 and PL2 are formed substantially in parallel to one another in a vertical direction crossing the horizontal direction.

The first pixel X1 and the second pixel X2 share the initializing voltage line VL, and the data lines DL1 through DL4 and the power lines PL1 and PL2 are formed to be a certain distance apart from each other. The lines DL1, DL2, PL1 in the first pixel X1 and the lines DL3, DL4, PL2 in the second pixel X2 face each other. The power lines PL1 and PL2 facing each other form a mesh structure by being interconnected by a connection node 303 extending in a horizontal direction, thereby supplying power in horizontal and vertical directions. Therefore, a wiring area for supplying power can be further expanded, and thus a voltage drop due to resistance of wirings can be reduced.

According to an embodiment, the first pixel X1 and the second pixel X2, which are two pixels adjacent to each other, are symmetrically formed by sharing the initializing voltage line VL, where the initializing voltage line VL can be formed on the same layer as the pixel electrodes 301 and 302. Furthermore, the connection node 303 can be formed on the same layer as the initializing voltage line VL and the pixel electrodes 301 and 302.

Top electrodes of capacitors are formed at the bottom layers of the pixel electrodes 301 and 302, where a top electrode 201 of a first capacitor Cst1 is formed at the first pixel X1 and a top electrode 202 of a second capacitor Cst2 is formed on the second pixel X2.

Meanwhile, according to an embodiment, a third electrode and a fourth electrode are further formed at the left side of the first pixel X1 and at the right side of the second pixel X2, respectively. A top electrode of a third capacitor included in the third pixel is integrated with the top electrode 201 of the first capacitor Cst1, whereas a top electrode of a fourth capacitor included in the fourth pixel can be integrated with the top electrode 202 of the second capacitor Cst2. Here, the pixel electrode 301 arranged at the first pixel X1 can be formed to cover the top electrode 201 of the first capacitor Cst1 and the top electrode of the third capacitor integrated with the same, whereas the pixel electrode 302 arranged at the second pixel X2 can be formed to cover the top electrode 202 of the second capacitor Cst2 and the top electrode of the fourth capacitor integrated with the same. Although the pixel electrodes 301 and 302 are shown in diamond-like shapes, shapes of the pixel electrodes 301 and 302 are not limited thereto.

The data lines DL1 through DL4 and the power lines PL1 and PL2 can be formed on the same layer as the top electrodes 201 and 202 of the capacitors, where a first data line DL2 included in the first pixel X1 in a vertical direction can be arranged at the right end of the first pixel X1, whereas a second data line DL3 included in the second pixel X2 in a vertical direction can be arranged at the left end of the second pixel X2. Furthermore, a data line DL1 of the third pixel can be arranged at the left end of the third pixel X3, whereas a data line DL4 of the fourth pixel can be arranged at the right end of the fourth pixel X4. Meanwhile, a first power line PL1 included in the first pixel X1 in a vertical direction can be integrated with the top electrode 201 of the first capacitor Cst1 included in the first pixel X1 and the third capacitor included in the third pixel X3, whereas a second power line PL2 in the second pixel X2 in a vertical direction can be integrated with the top electrode 202 of the second capacitor Cst2 included in the second pixel X2 and the fourth capacitor included in the fourth pixel X4. Therefore, since no signal line interconnecting the power lines PL1 and PL2 is arranged between the power lines PL1 and PL2 respectively corresponding to the first pixel X1 and third pixel at the left side and the second pixel X2 and the fourth pixel at the right side, the connection node 303 formed on the same layer as the pixel electrodes 301 and 302 is formed to be connected to the top electrodes 201 and 202 respectively integrated with the power lines PL1 and PL2, thereby interconnecting the power lines PL1 and PL2 extending in vertical directions. A first power line PL1 and a second power line PL2 extending in a vertical direction at each column line form a mesh structure with the connection node 303 extending in a horizontal direction, which interconnects two pixels adjacent to each other along a row line (e.g., X1 and X2).

Bottom electrodes 101 and 102 of the respective capacitors are formed at layers below the top electrodes 201 and 202 of the respective capacitors, where the bottom electrodes 101 and 102 can be arranged to be apart from each other. For example, the bottom electrode 101 is formed to overlap the top electrode 201 and to be apart from a bottom electrode of the third capacitor. In the same regard, the bottom electrode 102 is formed to overlap the top electrode 202 and to be apart from a bottom electrode of the fourth capacitor.

Furthermore, the first scan line SL1 and the emission control line EL2 extending in a horizontal direction are formed at a layer below the data lines DL1 through DL4 and the power lines PL1 and PL2 extending in a vertical direction. Here, the first scan line SL1 and the emission control line EL2 can be formed on the same layer as the bottom electrodes 101 and 102 of the capacitors. However, the described technology is not limited thereto.

Hereinafter, the structure of a display device according to an embodiment will be described in detail with reference to FIGS. 2 and 3.

The first pixel X1 and the second pixel X2, which are two pixels of the display device 100 according to an embodiment adjacent to each other, include a plurality of TFTs. TFTs include a driving TFT, a switching TFT, an emission control TFT, etc. Although not shown, the structure of TFTs will also be described below.

The substrate 50 can be an insulation substrate formed of a transparent $SiO_2$-based glass or a transparent plastic material. The substrate 50 can be a conductive substrate formed of a metal thin-film. The substrate 50 can be a flexible substrate or a rigid substrate.

A buffer layer 51 for preventing dispersion of impurity ions and permeation of moisture or the air and for providing a flat surface can be formed on the substrate 50. The buffer layer 51 can be formed of an inorganic insulation material, such as a silicon oxide, a silicon nitride, a silicon oxynitride, an aluminum oxide, an aluminum nitride, a titanium oxide, or a titanium nitride. The buffer layer 51 can also be formed of an organic insulation material, such as polyimide, polyester, and acryl, or can be formed as a stack of the above-stated materials or a stack of an organic insulation material and an inorganic insulation material. The buffer layer 51 is not an indispensable component and can be omitted according to process conditions.

An active layer including respective active patterns 91 and 92 of the first pixel X1 and the second pixel X2 is formed on the buffer layer 51. The active layer includes respective active patterns of a plurality of TFTs, e.g., driving TFT, a switching TFT, a compensating TFT, an initializing TFT, an operation control TFT, and an emission control TFT. For convenience of explanation, FIG. 3 shows the active pattern 91 of a first TFT, which is a driving TFT of the first pixel X1, and the active pattern 92 of a second TFT, which is a driving TFT of the second pixel X2.

The active patterns 91 and 92 can be formed as amorphous silicon layers, poly-crystalline silicon layers, or oxide semiconductor layers like G-I-Z-O layers $[(In_2O_3)_a(Ga_2O_3)_b(ZnO)_c$ layer] (where a, b, and c are real numbers satisfying the conditions a≥0, b≥0, and c≥0). The active patterns 91 and 92 can be formed as a single pattern within a single pixel or can be formed as two or more separated patterns.

A plurality of TFTs of pixel circuits are formed along the active patterns 91 and 92. An active pattern of each TFT includes a channel region, which is not doped with an impurity, and a source region and a drain region, which are doped with impurities, at both sides of the channel region. The impurities depend on types of TFTs and can be N-type impurities or P-type impurities.

The active patterns 91 and 92 can be formed to be bent in various shapes based on designs. Particularly, the active patterns 91 and 92 of the first and second TFTs, which are driving TFTs, can have shapes with a plurality of bent portions, e.g., a zigzagged shape, a S-like shape, or a flipped S-like shape. Therefore, a long channel region can be formed, and thus driving range of a gate voltage can be widened. Therefore, due to a wide driving range of a gate voltage, a grayscale of light emitted by an OLED can be controlled precisely by changing magnitude of a gate voltage, thereby increasing resolution and improving display quality of an OLED display device.

A gate insulation layer 52 is formed on the substrate 50 having formed thereon the active patterns 91 and 92. The gate insulation layer 52 can be formed of an oxide, a nitride, an oxynitride, or a combination thereof.

A first conductive layer CL1 is formed on the gate insulation layer 52. The first conductive layer CL1 includes the first scan line SL1, the emission control line EL2, and the bottom electrodes 101 and 102 of the capacitors Cst1 and Cst2 shown in FIG. 2, where the first conductive layer CL1 can be formed of a metal with low resistance, e.g., aluminum (Al), copper (Cu), etc.

Particularly, the bottom electrodes 101 and 102 of the capacitors Cst1 and Cst2 function as gates of driving TFTs. For example, the bottom electrode 101 of the first capacitor Cst1 included in the first pixel X1 functions as a gate of the first TFT included in the first pixel X1, whereas the bottom electrode 102 of the second capacitor Cst2 included in the second pixel X2 functions as a gate of the second TFT included in the second pixel X2. The bottom electrodes 101 and 102 of the capacitors Cst1 and Cst2 are separated from the first scan line SL1 and the emission control line EL2 and overlap channel regions of active patterns of driving TFTs as floating electrodes. The bottom electrodes 101 and 102 of the capacitors Cst1 and Cst2 can be separated from the bottom electrodes of the capacitors of adjacent pixels and formed to have rectangular shapes. In the same regard, the first conductive layer CL1 can include gates of respective TFTs other than a driving TFT.

An interlayer insulation layer 53 is formed on the first conductive layer CL1 to cover the first scan line SL1, the emission control line EL2, and the bottom electrodes 101 and 102 of the capacitors Cst1 and Cst2. The interlayer insulation layer 53 can function as a dielectric for the storage capacitor Cst and can be formed of an organic insulation material, an inorganic insulation material, or can be formed as a multilayered structure in which an organic insulation material and an inorganic insulation material are alternately stacked.

A second conductive layer CL2 is formed on the interlayer insulation layer 53, where the second conductive layer CL2 can include the data lines DL1 through DL4, the power lines PL1 and PL2, and the top electrodes 201 and 202 of the capacitors Cst1 and Cst2 shown in FIG. 2. The top electrodes 201 and 202 at least partially overlap the bottom electrodes 101 and 102, which are gates of the driving TFTs, thereby forming the storage capacitor Cst1 and Cst2.

As shown in FIG. 2, the top electrodes 201 of the first pixel X1 and a third pixel X3 formed at the left side of the first pixel X1 are integrated with each other, and the top electrode 201 is integrated with the first power line PL1 located at the boundary between the first pixel X1 and the third pixel X3. In the same regard, the top electrodes 202 of the second pixel X2 and a fourth pixel X4 formed at the right side of the second pixel X2 are integrated with each other, and the top electrode 202 is integrated with the second power line PL2 located at the boundary between the second pixel X2 and the fourth pixel X4. Therefore, when power voltages are supplied to the respective pixels in a vertical direction via the first power line PL1 and the second power line PL2, the power voltages can also be supplied in a horizontal direction via the connection node 303 connected to the top electrodes 201 and 202 respectively integrated with the power lines PL1 and PL2. Therefore, a mesh structure including the power lines PL1 and PL2 can be embodied, and thus a wiring area for supplying power can be expanded. As a result, a voltage drop due to parasitic resistance of wirings can be reduced For example, the top electrodes 201 of capacitors of the two pixels X1 and X3, which are adjacent to each other and share the first power line PL1, are integrated with each other, whereas the top electrodes 201 and 202 of the capacitors of the two pixels X1 and X2, which are adjacent to each other and are arranged at both sides of two data lines DL2 and DL3, are formed apart from each other. Furthermore, the top electrodes 201 and 202 of the capacitors of the two pixels X1 and X2 arranged at both sides of two data lines DL2 and DL3 are connected to each other via the connection node 303.

Meanwhile, since the bottom electrodes 101 and 102 function as gates of the driving TFTs of their respective pixels, the bottom electrodes 101 and 102 are formed apart from each other, unlike the top electrodes 201 and 202.

A planarizing layer 54 is formed on the second conductive layer CL2 to at least partially cover the data lines DL1 through DL4, the power lines PL1 and PL2, and the top electrodes 201 and 202 of the capacitors Cst1 and Cst2. The planarizing layer 54 can be formed of an organic insulation layer, where the organic insulation layer can be formed of a common general-purpose polymer, such as PMMA and PS, a polymer derivative containing a phenol group, an acrylic polymer, an imide-based polymer, an arylether-based polymer, an amide-based polymer, a fluoric polymer, a p-xylene-based polymer, a vinyl alcoholic polymer, or a combination thereof. Furthermore, the planarizing layer 54 can be an inorganic insulation layer formed of $SiO_2$, $SiN_x$, SiON, $Al_2O_3$, $TiO_2$, $Ta_2O_5$, $HfO_2$, $ZrO_2$, BST, or PZT. Furthermore, the planarizing layer 54 can be formed to have a composite stacked structure including an inorganic insulation layer and an inorganic insulation layer.

A third conductive layer CL3 is formed on the planarizing layer 54, where the third conductive layer CL3 can include the initializing voltage line VL, the pixel electrodes 301 and 302, and the connection node 303 shown in FIG. 2.

The connection node 303 include contact plugs 303P1 and 303P2 that penetrate through the planarizing layer 54 and are respectively connected to the top electrode 201 of the first capacitor Cst1 included in the first pixel X1 and the top electrode 202 of the second capacitor Cst2 included in the second pixel X2. For example, the planarizing layer 54 includes contact holes partially exposing the top electrodes 201 and 202 of the capacitors Cst1 and Cst2, and the contact plugs 303P1 and 303P2 of the connection node 303 are formed to fill the contact holes. Therefore, a first end of the connection node 303 partially overlaps the top electrode 201 of the first capacitor Cst1, whereas a second end of the connection node 303 partially overlaps the top electrode 202 of the second capacitor Cst2. Therefore, the connection node 303 interconnects the top electrode 201 of the first capacitor Cst1 included in the first pixel X1 and the top electrode 202 of the second capacitor Cst2 included in the second pixel X2 to embody a mesh structure of the power voltage ELVDD.

Furthermore, the top electrode 202 of the second capacitor Cst2 is formed across the first and second data lines DL2 and DL3 located between the top electrode 201 of the first capacitor Cst1 included in the first pixel X1 and the top electrode 202 of the second capacitor Cst2 included in the second pixel X2. Here, the first data line DL2 is connected to the first pixel X1 and the second data line DL3 is connected to the second pixel X2 and data signals are transmitted to the respective pixels.

The connection node 303 can be formed of the same material as the pixel electrodes 301 and 302. For example, the connection node 303 can be formed of at least one of ITO, IZO, ZnO, and $In_2O_3$.

In a display device according to an embodiment, one pixel electrode is arranged at each of the two pixels X1 and X3 adjacent to each other as shown in FIG. 2. In some embodiments, the pixel electrode 301 arranged at the first pixel X1 is not electrically connected to the first pixel X1 and is electrically connected to a TFT of a pixel arranged at a row line different from that of the first pixel X1. In the same regard, the pixel electrode 302 arranged at the second pixel X2 can be electrically connected to a TFT of a pixel arranged at a row line different from that of the second pixel X2.

The pixel electrodes 301 and 302 can have various shapes, such as a diamond-like shape, a hexagonal shape, etc., where the initializing voltage line VL can have a partially bent shape in correspondence to the shapes of the pixel electrodes 301 and 302. The initializing voltage line VL is formed to extend in a horizontal direction along a row line.

If a display device is a top-emission type, the pixel electrodes 301 and 302 can be arranged as reflective electrodes, and a counter electrode (not shown) can be arranged as a transparent electrode. In this case, the counter electrode can include a semi-transmissive reflective film, which is a thin-film formed of Ag, Mg, Al, Pt, Pd, Au, Ni, Nd, Ir, Cr, Li, or Ca, or can contain a phototransmissive metal oxide, such as ITO, IZO, and ZnO. If a display device is a bottom-emission type, the counter electrode can be formed to be reflective by depositing Ag, Mg, Al, Pt, Pd, Au, Ni, Nd, Ir, Cr, Li, or Ca. If the pixel electrodes 301 and 302 are used as anodes, the pixel electrodes 301 and 302 can include layers formed of metal oxides with high work function (absolute value), such as ITO, IZO, and ZnO. If the pixel electrodes 301 and 302 are used as cathodes, the pixel electrodes 301 and 302 can include highly conductive metals with low work function (absolute value), such as Ag, Mg, Al, Pt, Pd, Au, Ni, Nd, Ir, Cr, Li, and Ca. If the pixel electrodes 301 and 302 are used as anodes, the counter electrode is used as a cathode. If the pixel electrodes 301 and 302 are used as cathodes, the counter electrode is used as an anode.

An intermediate layer (not shown) interposed between the pixel electrodes 301 and 302 and the counter electrode can be formed of an organic monomer or an organic polymer. The intermediate layer can be formed by stacking an emissive layer (EML) and one or more function layers including a hole transport layer (HTL), a hole injection layer (HIL), an electron transport layer (ETL), and an electron injection layer (EIL). If organic materials of the intermediate layer emit red light, green light, and blue light, the emissive layers can be patterned into a red emissive layer, a green emissive layer, and a blue emissive layer corresponding to a red sub-pixel, a green sub-pixel, and a blue sub-pixel, respectively. Meanwhile, if organic materials of the intermediate layer emit white light, the emissive layer can have a multilayered structure for emitting a while light, in which a red emissive layer, a green emissive layer, and a blue emissive layer are stacked, or can have a single layer structure formed of a red light-emitting material, a green light-emitting material, and a blue light-emitting material. Alternatively, red, green, and blue color filter layers can be further included to display images of various colors.

Figure 4:
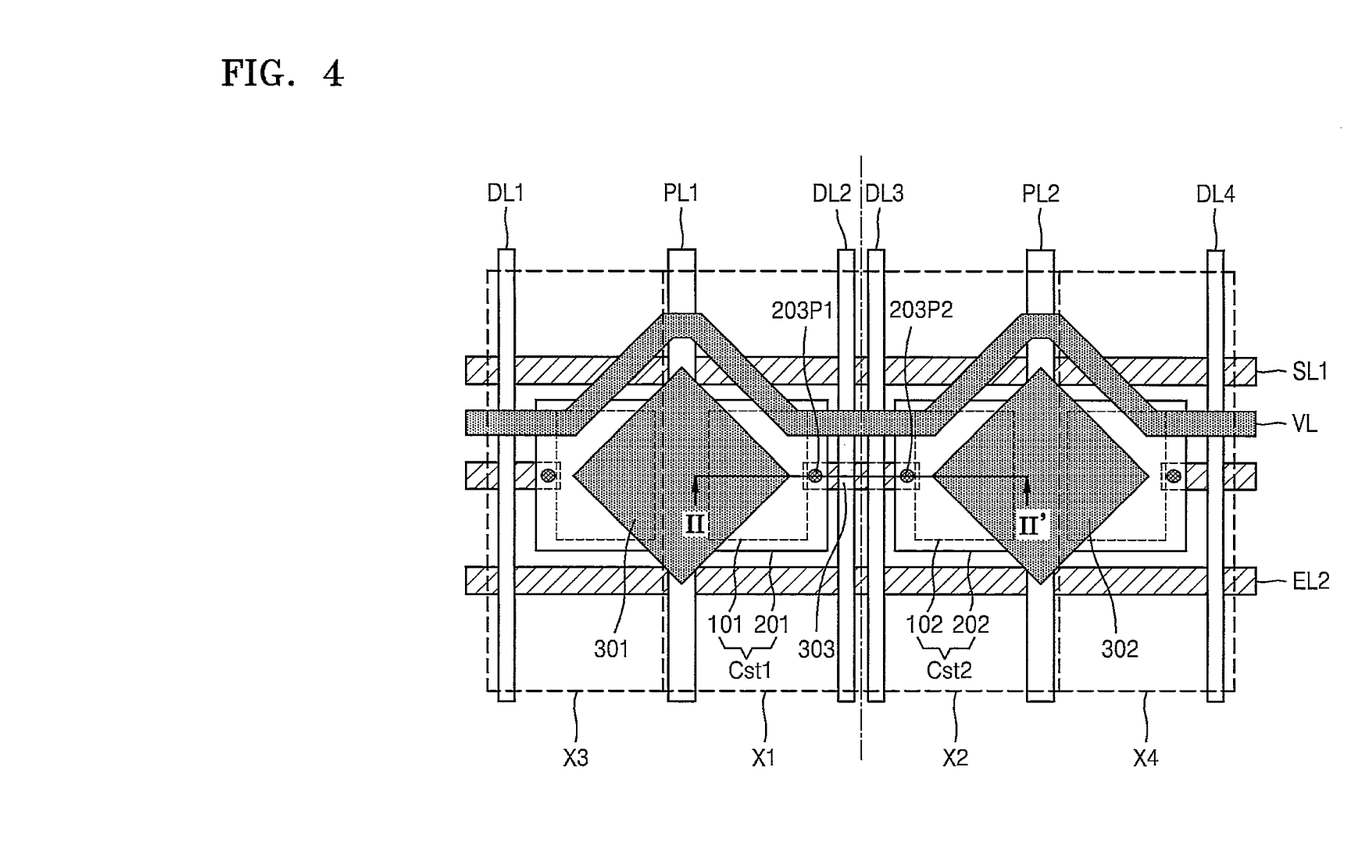
FIG. 4 is a schematic plan view of two adjacent pixels of a display device according to another embodiment.
Figure 5:
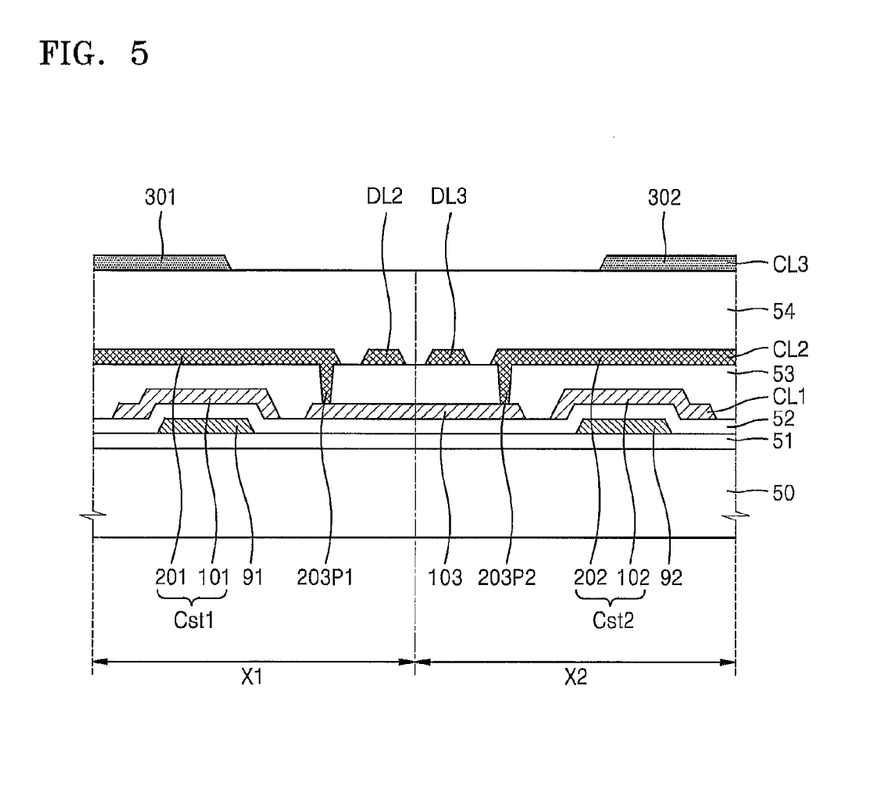
FIG. 5 is a sectional view obtained along a line II-II' of FIG. 4.

Hereinafter, an display device according to another embodiment will be described with reference to FIGS. 4 and 5. However, the embodiment shown in FIGS. 4 and 5 is identical to the above-stated embodiment shown in FIGS. 2 and 3 except location of a connection node, and thus detailed descriptions of the same components will be replaced with the descriptions given above. Furthermore, except the connection node, reference numerals used in FIGS. 4 and 5 are identical to those used in FIGS. 2 and 3.

FIG. 4 is a schematic plan view of two adjacent pixels of a display device according to another embodiment. FIG. 5 is a sectional view obtained along a line II-IF of FIG. 4.

Referring to FIGS. 4 and 5, a buffer layer 51 is formed on a substrate 50, and an active layer including respective active patterns 91 and 92 of the first pixel X1 and the second pixel X2 is formed on the buffer layer 51. The active layer includes respective active patterns of a plurality of TFTs. For convenience of explanation, FIG. 5 shows the active pattern 91 of a first TFT, which is a driving TFT of the first pixel X1, and the active pattern 92 of a second TFT, which is a driving TFT of the second pixel X2.

A gate insulation layer 52 is formed on the substrate 50 on which the active patterns 91 and 92 are formed.

A first conductive layer CL1 is formed on the gate insulation layer 52, where the first conductive layer CL1 includes a first scan line SL1, an emission control line EL2, the bottom electrodes 101 and 102 of capacitors Cst1 and Cst2, and a connection node 103 shown in FIG. 4. For example, unlike the above-stated embodiment in which a connection node is formed on the same layer as data lines DL1 through DL4 and power lines PL1 and PL2, the connection node 103 according to the present embodiment is formed on the same layer as the first scan line SL1.

The bottom electrodes 101 and 102 of the capacitors Cst1 and Cst2 function as gates of driving TFTs, and thus the bottom electrodes 101 and 102 of the capacitors Cst1 and Cst2 can be separated from adjacent pixels and formed in rectangular shapes.

The connection node 103 is formed to be separated from the bottom electrodes 101 and 102 on the first conductive layer CL1 and is connected to top electrodes 201 and 202 via contact plugs 203P1 and 203P2, thereby forming a mesh structure of an power voltage ELVDD. Therefore, the connection node 103 is formed across a portion below first and second data lines DL2 and DL3 located between the top electrode 201 of the first capacitor Cst1 included in the first pixel X1 and the top electrode 202 of the second capacitor Cst2 included in the second pixel X2.

An interlayer insulation layer 53 is formed on the first conductive layer CL1 to at least partially cover the first scan line SL1, the emission control line EL2, the bottom electrodes 101 and 102 of the capacitors Cst1 and Cst2, and the connection node 103. The interlayer insulation layer 53 functions as a dielectric for the storage capacitor Cst.

A second conductive layer CL2 is formed on the interlayer insulation layer 53, where the second conductive layer CL2 can include the data lines DL1 through DL4, the power lines PL1 and PL2, and the top electrodes 201 and 202 of the capacitors Cst1 and Cst2 shown in FIG. 4. The top electrodes 201 and 202 overlap the bottom electrodes 101 and 102, which are gates of the above-stated driving TFTs, thereby forming the storage capacitor Cst1 and Cst2.

Meanwhile, the top electrodes 201 of capacitors of the two pixels X1 and X3, which are adjacent to each other and share the first power line PL1, are integrated with each other, whereas the top electrodes 201 and 202 of the capacitors of the two pixels X1 and X2, which are adjacent to each other and are arranged at both sides of two data lines DL2 and DL3, are formed apart from each other. Furthermore, the top electrodes 201 and 202 of the capacitors of the two pixels X1 and X2 arranged at both sides of two data lines DL2 and DL3 are connected to each other via the connection node 103.

The top electrode 201 of the first capacitor Cst1 includes a contact plug 203P1, which penetrates through the interlayer insulation layer 53 and is connected to one end of the connection node 103 adjacent to the first pixel X1. In the same regard, the top electrode 202 of the second capacitor Cst2 includes a contact plug 203P2, which penetrates through the interlayer insulation layer 53 and is connected to another end of the connection node 103 adjacent to the second pixel X2. Therefore, the first end of the connection node 103 partially overlaps the top electrode 201 of the first capacitor Cst1, whereas the second end of the connection node 103 partially overlaps the top electrode 202 of the second capacitor Cst2. Therefore, the connection node 103 interconnects the top electrode 201 of the first capacitor Cst1 included in the first pixel X1 and the top electrode 202 of the second capacitor Cst2 included in the second pixel X2 to embody a mesh structure of the power voltage ELVDD.

A planarizing layer 54 is formed on the second conductive layer CL2 to at least partially cover the data lines DL1 through DL4, the power lines PL1 and PL2, and the top electrodes 201 and 202 of the capacitors Cst1 and Cst2. The planarizing layer 54 can be formed of an organic insulation material and/or an inorganic insulation material.

A first conductive layer CL1 is formed on the planarizing layer 54, where the third conductive layer CL3 can include the initializing voltage line VL and the pixel electrodes 301 and 302 shown in FIG. 4.

One pixel electrode is arranged at each of the two pixels X1 and X3 adjacent to each other as shown in FIG. 2. In some embodiments, the pixel electrode 301 arranged at the first pixel X1 is not electrically connected to the first pixel X1 and is electrically connected to a TFT of a pixel arranged at a row line different from that of the first pixel X1. In the same regard, the pixel electrode 302 arranged at the second pixel X2 can be electrically connected to a TFT of a pixel arranged at a row line different from that of the second pixel X2.

The pixel electrodes 301 and 302 can have various shapes, such as a diamond-like shape, a hexagonal shape, etc., where the initializing voltage line VL can have a partially bent shape in correspondence to the shapes of the pixel electrodes 301 and 302. The initializing voltage line VL is formed to extend in a horizontal direction along a row line.

Since a counter electrode and an intermediate layer are identical to those in the above-stated embodiment, detailed descriptions thereof will be omitted.

Figure 6:
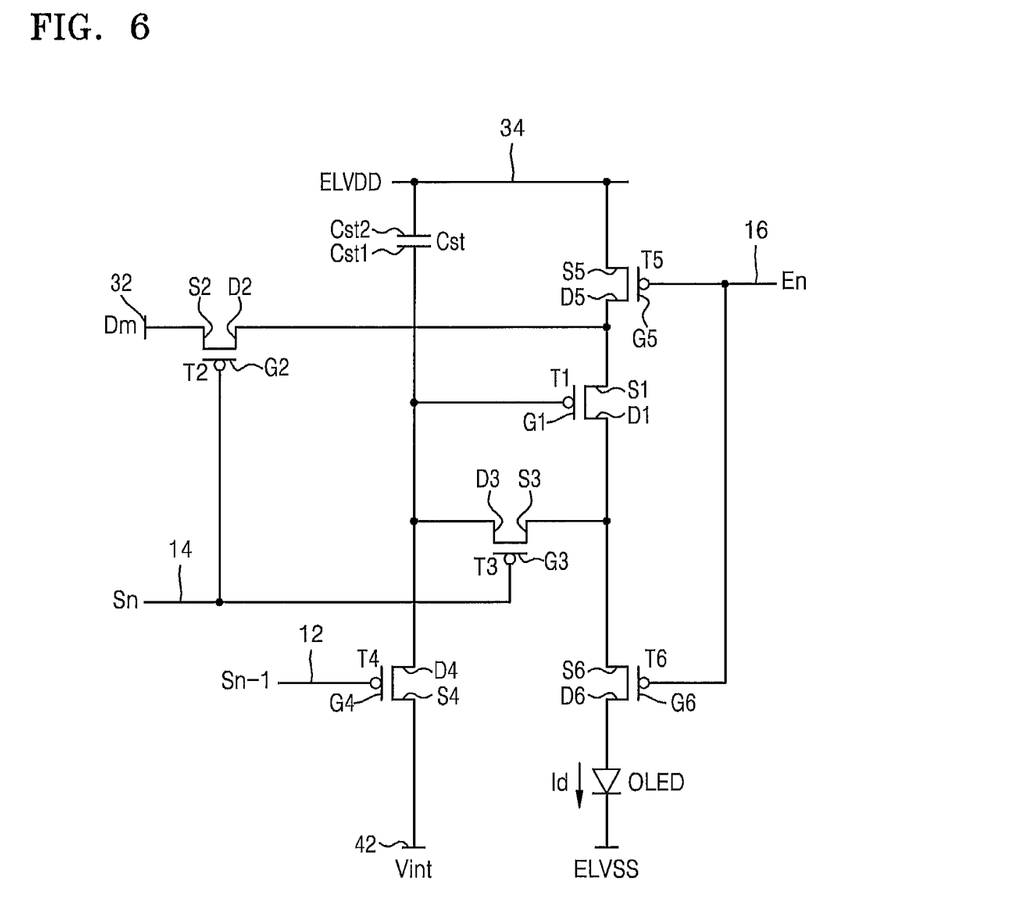
FIG. 6 is an example equivalent circuit diagram of a pixel of the display device of FIG. 1.

FIG. 6 is an example equivalent circuit diagram of a pixel of the display device of FIG. 1.

As shown in FIG. 6, a pixel of a OLED display device according to embodiments is connected to a plurality of signal lines 12, 14, 16, 32, 34, and 42 and includes a pixel circuit including a plurality of TFTs T1, T2, T3, T4, T5, and T6 and a storage capacitor Cst. Furthermore, a pixel includes an OLED, which receives a driving current via the pixel circuit and emits a light.

The plurality of TFTs can include a driving TFT T1, a switching TFT T2, a compensating TFT T3, an initializing TFT T4, an operation control TFT T5, and an emission control TFT T6.

The signal lines can include a first scan line 14 for transmitting a first scan signal Sn, a second scan line 12 for transmitting a second scan signal Sn−1 to the initializing TFT T4, a emission control line 16 for transmitting an emission control signal En to the operation control TFT T5 and the emission control TFT T6, a data line 32, which intersects the first scan line 14 and transmits a data signal Din, a driving voltage line 34, which transmits a power voltage ELVDD and extends in parallel to the data line 32, and an initializing voltage line 42 for transmitting an initializing voltage Vint for resetting the driving TFT T1.

A gate electrode G1 of the driving TFT T1 is connected to a first electrode Cst1 of the storage capacitor Cst. A source electrode S1 of the driving TFT T1 is connected to the driving voltage line 34 via the operation control TFT T5. A drain electrode D1 of the driving TFT T1 is electrically connected to an anode of the OLED via the emission control TFT T6. The driving TFT T1 receives a data signal Dm and supplies a driving current Id to the OLED based on switching operation of the switching TFT T2.

A gate electrode G2 of the switching TFT T2 is connected to the first scan line 14, and a source electrode S2 of the switching TFT T2 is connected to the data line 32. A drain electrode D2 of the switching TFT T2 is connected to the source electrode S1 of the driving TFT T1 and is connected to the driving voltage line 34 via the operation control TFT T5. The switching TFT T2 is turned on by the first scan signal Sn transmitted via the first scan line 14 and performs a switching operation for transmitting the data signal Dm transmitted to the data line 32 to the source electrode S1 of the driving TFT T1.

A gate electrode G3 of the compensating TFT T3 is connected to the first scan line 14. A source electrode S3 of the compensating TFT T3 is connected to the drain electrode D1 of the driving TFT T1 and is connected to an anode of the OLED via the emission control TFT T6. A drain electrode D3 of the compensating TFT T3 is connected to the first electrode Cst1 of the storage capacitor Cst, a drain electrode D4 of the initializing TFT T4, and the gate electrode G1 of the driving TFT T1 in common. The compensating TFT T3 is turned on by the first scan signal Sn transmitted via the first scan line 14 and diode-connects the driving TFT T1 by connecting the gate electrode G1 and the drain electrode D1 of the driving TFT T1 to each other.

A gate electrode G4 of the initializing TFT T4 is connected to the second scan line 12, and a source electrode S4 of the initializing TFT T4 is connected to the initializing voltage line 42. A drain electrode D4 of the initializing TFT T4 is connected to the first electrode Cst1 of the storage capacitor Cst, the drain electrode D3 of the compensating TFT T3, and the gate electrode G1 of the driving TFT T1 in common. The initializing TFT T4 is turned on by the second scan signal Sn−1 transmitted via the second scan line 12 and performs an initializing operation for initializing voltage of the gate electrode G1 of the driving TFT T1 by transmitting the initializing voltage Vint to the gate electrode G1 of the driving TFT T1.

A gate electrode G5 of the operation control TFT T5 is connected to the emission control line 16, a source electrode S5 of the operation control TFT T5 is connected to the driving voltage line 34, and a drain electrode D5 of the operation control TFT T5 is connected to the source electrode S1 of the driving TFT T1 and the drain electrode D2 of the switching TFT T2 in common.

A gate electrode G6 of the emission control TFT T6 is connected to the emission control line 16, and a source electrode S6 of the emission control TFT T6 is connected to the drain electrode D1 of the driving TFT T1 and the source electrode S3 of the compensating TFT T3 in common. A drain electrode D6 of the emission control TFT T6 is connected to an anode of the OLED. The operation control TFT T5 and the emission control TFT T6 are substantially simultaneously turned on by an emission control signal En transmitted via the emission control line 16 and allows an driving current Id to flow into the OLED.

A second electrode Cst2 of the storage capacitor Cst is connected to the driving voltage line 34. The first electrode Cst1 of the storage capacitor Cst is connected to the gate electrode G1 of the driving TFT T1, the drain electrode D3 of the compensating TFT T3, and the drain electrode D4 of the initializing TFT T4 in common.

A cathode of an OLED is connected to a common voltage ELVSS. The OLED receives an driving current Id supplied by the driving TFT T1 and emits lights, thereby displaying an image.

Hereinafter, operations of a pixel of the OLED display device shown in FIG. 6 will be described in detail.

First, for an initializing period, a low-level second scan signal Sn−1 is supplied via the second scan line 12. Next, the initializing TFT T4 is turned on in response to the low-level second scan signal Sn−1, an initializing voltage Vint is transmitted to the gate electrode G1 of the driving TFT T1 from the initializing voltage line 42 via the initializing TFT T4, and the driving TFT T1 is initialized by the initializing voltage Vint.

Next, during a data programming period, a low-level first scan signal Sn is supplied via the first scan line 14. Next, in response to the low-level first scan signal Sn, the switching TFT T2 and the compensating TFT T3 are turned on. Here, the driving TFT T1 is diode-connected and forward biased by the turned-on compensating TFT T3.

Next, a compensated voltage Dm-Vth, which is the data signal Din supplied from the data line 32 less a threshold voltage Vth of the driving TFT T1, is applied to the gate electrode G1 of the driving TFT T1.

A power voltage ELVDD and the compensated voltage Dm-Vth are applied to two opposite ends of the storage capacitor Cst, respectively and charges corresponding to a voltage difference between the two opposite ends ELVDD-Din+Vth are stored in the storage capacitor Cst. Next, during an emission period, a emission control signal En supplied from the emission control line 16 is changed from high level to low level. Next, the operation control TFT T5 and the emission control TFT T6 are turned on by the low-level emission control signal En during the emission period.

As the operation control TFT T5 and the emission control TFT T6 are turned on, a driving current Id is generated based on a voltage difference between a voltage of the gate electrode G1 of the driving TFT T1 and the power voltage ELVDD, and the driving current Id is supplied to an OLED via the emission control TFT T6. During the emission period, a gate-source voltage Vgs of the driving TFT T1 is maintained at 'ELVDD-Dm+Vth' by the storage capacitor Cst and, according to a current-voltage relationship of the driving TFT T1, the driving current Id is proportional to the square of a value obtained by subtracting a threshold voltage Vth from a source-gate voltage, that is, $(ELVDD-Dm)^2$. Therefore, the driving current Id is determined regardless of the threshold voltage Vth of the driving TFT T1.

The circuit diagram shown in FIG. 6 is an example and can vary based on designs.

According to at least one of the disclosed embodiments, an OLED display is can compensate for a drop of a power voltage applied to respective pixels of a large display panel.

Furthermore, an OLED display according to an embodiment can secures sufficient space between wirings, and thus can stably embody a large high-resolution panel.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details can be made therein without departing from the spirit and scope as defined by the following claims.

What is claimed is:

1. An organic light-emitting diode (OLED) display, the OLED display comprising:
   first and second pixels respectively including first and second capacitors, wherein each of the first and second capacitors includes top and bottom electrodes, and wherein the first and second pixels respectively include first and second pixel electrodes;
   a substrate;
   a first conductive layer formed over the substrate and including the bottom electrodes of the first and second capacitors;
   a second conductive layer formed over the first conductive layer and including the top electrodes of the first and second capacitors; and
   a third conductive layer formed over the second conductive layer and including the first and second pixel electrodes, and a connection node extending from the first pixel to the second pixel and interconnecting the first capacitor of the first pixel and the second capacitor of the second pixel, wherein the first and third conductive layers are not in direct physical contact with each other.

2. The OLED display of claim 1, wherein the first conductive layer comprises a scan line electrically connected to the first and second pixels.

3. The OLED display of claim 1, wherein the second conductive layer comprises i) a first data line electrically connected to the first pixel and ii) a second data line electrically connected to the second pixel.

4. The OLED display of claim 3, wherein the connection node is formed over the first and second data lines.

5. The OLED display of claim 1, wherein the second conductive layer comprises a first power line and a second power line configured to supply power voltages,
   wherein the first power line is integrally formed with the top electrode of the first capacitor, and
   wherein the second power line is integrally formed with the top electrode of the second capacitor.

6. The OLED display of claim 1, wherein the first and second capacitors are adjacent to each other.

7. The OLED display of claim 1, further comprising an organic insulation layer formed between the second and third conductive layers,
   wherein the connection node comprises a plurality of contact plugs penetrating through the organic insulation layer and electrically connected to the first and second capacitors.

8. The OLED display of claim 1, wherein the connection node is formed of at least one of ITO, IZO, ZnO, and $In_2O_3$.

9. The OLED display of claim 1, further comprising:
   a first thin-film transistor (TFT) including the bottom electrode of the first capacitor configured to function as a gate electrode;
   a second TFT including the bottom electrode of the second capacitor configured to function as a gate electrode, wherein each of the first and second TFTs includes an active pattern; and
   an active layer formed below the first conductive layer and including the active patterns of the first and second TFTs.

10. The OLED display of claim 1, further comprising:
    third and fourth pixels respectively comprising third and fourth capacitors, wherein each of the third and fourth capacitors includes a top electrode,
    wherein the second conductive layer further includes the top electrodes of the third and fourth capacitors,
    wherein the top electrode of the third capacitor is integrally formed with the top electrode of the first capacitor, and
    wherein the top electrode of the fourth capacitor is integrally formed with the top electrode of the second capacitor.

11. An organic light-emitting diode (OLED) display comprising:
    a first pixel comprising a first capacitor including a first bottom electrode and a first top electrode;
    a second pixel comprising a second capacitor including a second bottom electrode and a second top electrode;
    a first conductive layer including the first and second bottom electrodes and a connection node extending from the first pixel to the second pixel and interconnecting the first top electrode of the first pixel and the second top electrode of the second pixel;
    a second conductive layer formed over the first conductive layer and including the first and second top electrodes and a power line configured to supply power voltages to the first and second pixels; and
    a third conductive layer formed over the second conductive layer, wherein the first and second pixels respectively include first and second pixel electrodes, wherein the third conductive layer includes the first and second pixel electrodes, and wherein the first and third conductive layers are not in direct physical contact with each other.

12. The OLED display of claim 11, wherein the first conductive layer comprises a scan line electrically connected to the first and second pixels.

13. The OLED display of claim 11, wherein the second conductive layer comprises i) a first data line electrically connected to the first pixel and ii) a second data line electrically connected to the second pixel.

14. The OLED display of claim 13, wherein the connection node is formed below the first and second data lines.

15. The OLED display of claim 11, wherein the connection node is formed apart from the first and second bottom electrodes.

16. The OLED display of claim 11, wherein the first and second capacitors are adjacent to each other, and
    wherein the power line is integrally formed with the top electrode of the first capacitor or the top electrode of the second capacitor.

17. The OLED display of claim 11, further comprising an organic insulation layer formed between the second and third conductive layers,
    wherein the first and second top electrodes comprise a plurality of contact plugs, and wherein the contact plugs penetrate through the organic insulation layer and are electrically connected to the connection node.

18. The OLED display of claim 11, further comprising:
    a first thin-film transistor (TFT) include the bottom electrode of the first capacitor configured to function as a gate electrode;
    a second TFT include the bottom electrode of the second capacitor configured to function as a gate electrode, wherein each of the first and second TFTs includes an active pattern; and an active layer formed below the first conductive layer and including the active patterns of the first and second TFTs.

19. The OLED display of claim 11, further comprising:
third and fourth pixels respectively comprising third and fourth capacitors, wherein each of the third and fourth capacitors includes a top electrode,
wherein the second conductive layer further includes the top electrodes of the third and fourth capacitors,
wherein the top electrode of the third capacitor is integrally formed with the top electrode of the first capacitor, and
wherein the top electrode of the fourth capacitor is integrally formed with the top electrode of the second capacitor.

20. The OLED display of claim 1, wherein the top electrodes of the first and second capacitors are not directly connected to each other.

21. The OLED display of claim 1, wherein neither of the top and bottom electrodes of the first capacitor is shared with the second capacitor.

* * * * *